(12) United States Patent
Won et al.

(10) Patent No.: US 8,908,462 B2
(45) Date of Patent: Dec. 9, 2014

(54) SEMICONDUCTOR DEVICE INCLUDING CURRENT COMPENSATOR

(71) Applicant: SK Hynix Inc., Icheon-si, Gyeonggi-do (KR)

(72) Inventors: Sam Kyu Won, Hwaseong-si (KR); Cheul Hee Koo, Yongin-si (KR); Duck Ju Kim, Icheon-si (KR); Won Kyung Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 80 days.

(21) Appl. No.: 13/845,350

(22) Filed: Mar. 18, 2013

(65) Prior Publication Data

US 2014/0160864 A1   Jun. 12, 2014

(30) Foreign Application Priority Data

Dec. 7, 2012   (KR) ........................ 10-2012-0141723

(51) Int. Cl.
*G11C 5/14* (2006.01)
*G05F 3/02* (2006.01)

(52) U.S. Cl.
CPC . *G11C 5/147* (2013.01); *G05F 3/02* (2013.01)
USPC ....................................................... 365/226

(58) Field of Classification Search
USPC ....................................................... 365/226
See application file for complete search history.

(56) References Cited

U.S. PATENT DOCUMENTS

2004/0008567 A1   1/2004   Furuyama

FOREIGN PATENT DOCUMENTS

KR   1020120033439 A   4/2012
WO   2010033409 A1    3/2010

OTHER PUBLICATIONS

Jie Gu et al., "Design and Implementation of Active Decoupling Capacitor Circuits for Power Supply Regulation in Digital ICs", Feb. 2009, IEEE Transactions on Very Large Scale Integration (VLSI) Systems, vol. 17 No. 2, pp. 292-301.*
Michael Ang et al., "An On-chip Voltage Regulator using Switched Decoupling Capacitors", 2000, IEEE International Solid-State Circuits Conference.*
Jie Gu et al., Distributed Active Decoupling Capacitors for On-Chip Supply Noise Cancellation in Digital VLSI Circuits, Symposium on VLSI Circuits Digest of Technical Papers, 2006.

* cited by examiner

*Primary Examiner* — Hoai V Ho
*Assistant Examiner* — Jay Radke
(74) *Attorney, Agent, or Firm* — William Park & Associates Patent Ltd.

(57)   ABSTRACT

The present technology relates to an electronic device, and more particularly, to a semiconductor device. The semiconductor device includes a peripheral circuit, a power output line connected to the peripheral circuit and configured to transmit an operation voltage to the peripheral circuit, a current compensator including an OP-amplifier connected to the power output line, and a capacitor connected between an output terminal of the OP-amplifier and the power output line.

8 Claims, 3 Drawing Sheets

SEMICONDUCTOR DEVICE INCLUDING CURRENT COMPENSATOR

CROSS-REFERENCE TO RELATED APPLICATION

This application is based on and claims priority from Korean Patent Application No. 10-2012-0141723, filed on Dec. 7, 2012, with the Korean Intellectual Property Office, the disclosure of which is incorporated herein in its entirety by reference.

BACKGROUND

1. Field

The present invention generally relates to an electronic device, and more particularly, to a semiconductor device.

2. Discussion of Related Art

A semiconductor memory device is a memory device implemented by using a semiconductor, such as silicon (Si), germanium (Ge), gallium arsenide (GaAs), and indium phosphide (InP). Semiconductor memory device is generally divided into a volatile memory device and a nonvolatile memory device.

The volatile memory device is a memory device in which when power is removed, stored data dissipates. Examples of a volatile memory device include a Static RAM (SRAM), a Dynamic RAM (DRAM), a Synchronous DRAM (SDRAM), and the like. The nonvolatile memory device is a memory device in which even though power is removed, stored data is maintained. Examples of a nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

When the semiconductor memory device is driven, excessive current is generated inside the semiconductor memory device, enough so that an operation voltage of the semiconductor memory device may be unstable. This may occur due to excessive consumption of current for a specific time interval by a peripheral circuit within the semiconductor memory device. Accordingly, when the current is excessively consumed, there is a greater demand for additional current, other than for operation power.

SUMMARY

The present invention has been made in an effort to decrease the area of a semiconductor device despite demands for additional current.

An embodiment of the present invention provides a semiconductor device including: a peripheral circuit; a power output line connected to the peripheral circuit, and configured to transmit an operation voltage to the peripheral circuit; and a current compensator including an OP-amplifier connected to the power output line, and a capacitor connected between an output terminal of the OP-amplifier and the power output line.

According to an embodiment of the present invention, the semiconductor device may further include a control logic, configured to control the peripheral circuit, in which the control logic is configured to enable a compensation control signal for a predetermined time interval, and the OP-amplifier activated according to the compensation control signal.

According to an embodiment of the present invention, the peripheral circuit may include an internal voltage generation unit configured to receive an external power voltage and generate an internal power voltage by using the external power voltage. The internal power voltage may be provided to the power output line as the operation voltage.

According to an embodiment of the present invention, the semiconductor device may further include a memory cell array driven by the peripheral circuit, in which the peripheral circuit may include: a read and write circuit connected to the memory cell array through bit lines and operated by using the operation voltage received through the power output line; a voltage pump configured to generate high voltages by using the operation voltage provided through the power output line; an address decoder connected to the memory cell array through word lines and configured to switch the high voltages to the word lines; and a control logic configured to control the read and write circuit, the voltage pump, and the address decoder. The current compensator may be adjacently disposed to the voltage pump or to the read and write circuit.

Another embodiment of the present invention provides a semiconductor device including: a peripheral circuit; a first power output line configured to transmit an external power voltage to the peripheral circuit; an internal voltage generation unit configured to generate an internal power voltage by using the external power voltage; a second power output line configured to transmit the internal power voltage to the peripheral circuit; and a first current compensator including a first OP-amplifier connected to the first power output line and a first capacitor connected between an output terminal of the first OP-amplifier and the second power output line.

According to an embodiment of the present invention, the semiconductor device may further include a second current compensator including a second OP-amplifier connected to the second power output line and a second capacitor connected between an output terminal of the second OP-amplifier and the first power output line.

According to an embodiment of the present invention, the semiconductor device may further include: a third current compensator including a third OP-amplifier connected to the first power output line and a third capacitor connected between an output terminal of the third OP-amplifier and the first power output line; and a fourth current compensator including a fourth OP-amplifier connected to the second power output line and a fourth capacitor connected between an output terminal of the fourth OP-amplifier and the second power output line.

According to various embodiments of the present invention, a semiconductor device having a decreased area despite demands for additional current is provided.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, various embodiments of the present invention will be described with reference to the accompanying drawings in detail. However, the present invention is not limited to the embodiments disclosed below and may be implemented in various forms, and the scope of the present invention is not limited to the following embodiments. Rather, the embodiments are provided to more fully disclose the present invention and to completely transfer the spirit of the present invention to those skilled in the art to which the present invention pertains, and the scope of the present invention should be understood by the claims of the present invention.

Throughout this specification and the claims that follow, when it is described that an element is "coupled" to another element, the element may be "directly coupled" to the other element or "indirectly coupled" to the other element with a third element interposed therebetween. In addition, unless explicitly described to the contrary, the word "comprise" and variations, such as "comprises" or "comprising", will be understood to imply the inclusion of stated elements but not the exclusion of any other elements.

Figure 1:
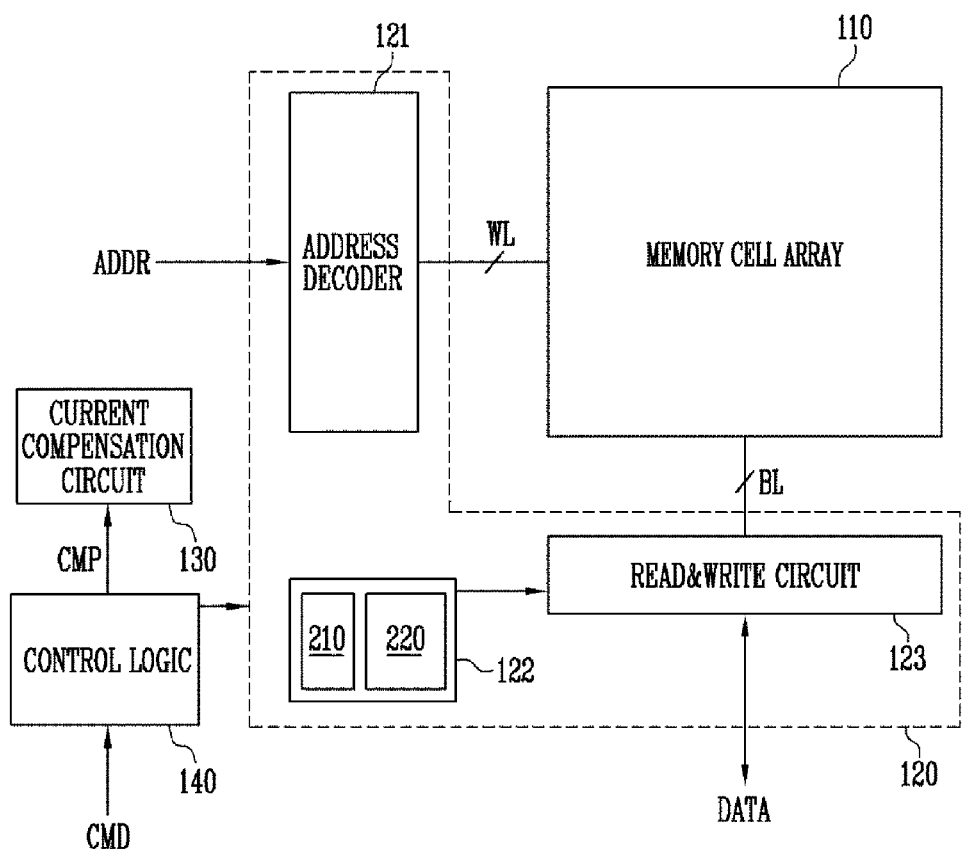
FIG. 1 is a block diagram illustrating a semiconductor device according to an embodiment of the present invention.

Referring to FIG. 1, the semiconductor device 100 may include a memory cell array 110, a peripheral circuit 120, a current compensation circuit 130, and a control logic 140.

The memory cell array 110 may include a plurality of memory blocks BLK1 to BLKz (not shown), which may be connected to an address decoder 121 through word lines WL. The plurality of memory blocks BLK1 to BLKz may also be connected to a read and write circuit 123 through bit lines BL. Each of the plurality of memory blocks BLK1 to BLKz may include a plurality of memory cells, each of which may be nonvolatile.

The peripheral circuit 120 may be configured so as to drive the memory cell array 110. The peripheral circuit 120 may include an address decoder 121, a voltage generator 122, and a read and write circuit 123.

The address decoder 121 may be connected to the memory cell array 110 through the word lines WL and configured to be operated in response to control of the control logic 140. The address decoder 121 may receive an address ADDR from an input/output buffer (not shown) inside the semiconductor device 100.

The address decoder 121 may be configured so as to decode a block address among the received addresses ADDR. The address decoder 121 may select at least one memory block according to a decoded block address.

The address decoder 121 may also be configured so as to decode a row address among the received addresses ADDR. The address decoder 121 may be configured so as to select one word line by switching high voltages from the voltage generator 122 to the word lines WL according to the decoded row address.

The address decoder 121 may be configured so as to decode a column address among the received addresses ADDR. The address decoder 121 may transmit the decoded column address to the read and write circuit 123.

A program of the semiconductor device 100 may be performed in the unit of a page. The address ADDR received when a program is requested may include a block address, a row address, and a column address. The address decoder 121 may select one memory block and one word line according to the block address and the row address. The column address may be decoded by the address decoder 121 to be provided to the read and write circuit 123.

The address decoder 121 may include a block decoder, a row decoder, a column decoder, and an address buffer.

The voltage generator 122 may include an internal voltage generation unit 210 and a voltage pump 220. The internal voltage generation unit 210 and the voltage pump 220 may be operated in response to the control of the control logic 140.

The internal voltage generation unit 210 may be configured so as to receive a power voltage provided from an external source (hereinafter, an external power voltage), and generate an internal power voltage. For example, the internal voltage generation unit 210 may be configured so as to regulate the external power voltage to generate the internal power voltage having a stable voltage.

The voltage pump 220 may be configured so as to generate a plurality of high voltages by using at least one of the external power voltage and the internal power voltage. The voltage generator 122 may include a plurality of pumping capacitors, and may generate a plurality of high voltages by selectively activating the plurality of pumping capacitors. The plurality of generated high voltages may be provided to the address decoder 121, which then may drive the word lines WL by using the plurality of provided high voltages.

The read and write circuit 123 may be connected to the memory cell array 110 through the bit lines BL and operated in response to the control logic 140.

In a program operation, the read and write circuit 123 may exchange data DATA with an input/output buffer (not shown) of the semiconductor device 100. The read and write circuit 123 may receive data DATA to be programmed. Then, the read and write circuit 123 may transmit the data DATA to be programmed to the bit lines indicated by the decoded column address among the bit lines BL whenever a program pulse is applied to the selected word line. The transmitted data DATA may be programmed into the memory cells connected to the selected word line. When a read operation is performed, the read and write circuit 123 may read data from the memory cells of the selected word line through the bit lines indicated by the decoded column address among the bit lines BL, and output the read data DATA. For the aforementioned operation of the read and write circuit 123, at least one of the external power voltage and the internal power voltage may be provided to the read and write circuit 123.

In an embodiment of the present invention, the read and write circuit 123 may include page buffers, a column selection circuit, and the like.

The current compensation circuit 130 may assist at least one of the external power voltage and the internal power voltage. The current compensation circuit 130 may be configured so as to supply current to at least one element inside the semiconductor device 100 when peak current is generated inside the semiconductor device 100. This will be described in more detail with reference to FIG. 2.

The control logic 140 may be connected to the peripheral circuit 120 and the current compensation circuit 130. The control logic 140 may receive a command CMD from the input/output buffer (not shown) of the semiconductor device 100. The control logic 140 may be configured so as to control the peripheral circuit 120 and the current compensation circuit 130 in response to the command CMD.

The control logic 140 may transmit a compensation control signal CMP to the current compensation circuit 130. The control logic 140 may activate the compensation control signal CMP for a predetermined time interval. For example, the control logic 140 may activate the compensation control signal CMP for a predetermined time intervals when the program operation is performed, and activate the compensation control signal CMP for a predetermined time interval when the read operation is performed.

Figure 2:
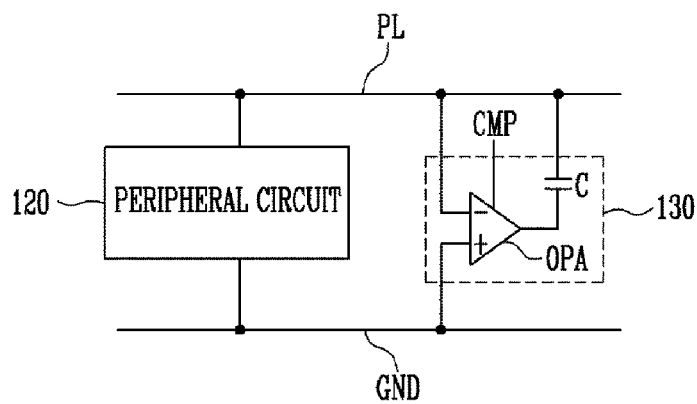
FIG. 2 is a block diagram illustrating a peripheral circuit and a current compensation circuit according to an embodiment of the present invention.

Referring to FIG. 2, the peripheral circuit 120 and the current compensation circuit 130 may be connected between a power output line PL and a ground line GND. The power output line PL may be configured as to transmit an operation voltage of the peripheral circuit 120. The power output line PL may transmit the internal power voltage from the internal voltage generation unit 210, and the transmitted internal power voltage may be used as the operation voltage of the peripheral circuit 120. In another embodiment of the present invention, the power output line PL may transmit the external power voltage from the internal voltage generation unit 210, and the transmitted external power voltage may be used as the operation voltage of the peripheral circuit 120.

The current compensation circuit 130 may be configured so as to provide current to the power output line PL when the peak current is generated inside the semiconductor device 100 and the voltage of the power output line PL is stable. The current compensation circuit 130 may include an OP-amplifier OPA and a capacitor C.

The OP-amplifier OPA may be connected to the power output line PL, where an inverse terminal (−) of the OP-amplifier OPA may be connected to the power output line PL, and a non-inverse terminal (+) of the OP-amplifier OPA may be connected to the ground line GND. An output terminal of the OP-amplifier OPA may be connected to a capacitor C. The OP-amplifier OPA may be activated or deactivated in response to the compensation control signal CMP received from the control logic 140 (see FIG. 1).

The capacitor C may be connected between the output terminal of the OP-amplifier OPA and the power output line PL. and may be configured with a combination of a plurality of MOS transistors.

A quantity of current provided to the power output line PL is proportional to an efficiency value determined by a gain of the OP-amplifier OPA and capacitance of the capacitor C. For example, the efficiency value may be calculated as represented in Equation 1.

$$CC = (1+A) \times CL \quad \text{Equation 1}$$

Referring to FIG. 1, the efficiency value CC may be calculated by multiplying a value obtained by adding 1 to the gain A of the OP-amplifier OPA by the capacitance CL of the capacitor C. Then, the quantity of current provided to the power output line PL may be proportional to the efficiency value CC.

For example, when it is assumed that the gain A of the OP-amplifier OPA is 100, and the capacitance CL of the capacitor C is 10 pF, the efficiency value CC is about 1 nF. When it is assumed that only the capacitor is connected between the power output line PL and the ground line GND instead of the current compensation circuit 130 for the same effect, a capacitor having capacitance of 1 nF is demanded. In order for the capacitor to have high capacitance, a large area may be required.

According to an embodiment of the present invention, the current compensation circuit 130 including the OP-amplifier OPA and the capacitor C is provided to decrease the area of the semiconductor device 100.

In FIG. 1, for convenience, the voltage generator 122 and the read and write circuit 123 in the peripheral circuit 120 are only illustrated.

Figure 3:
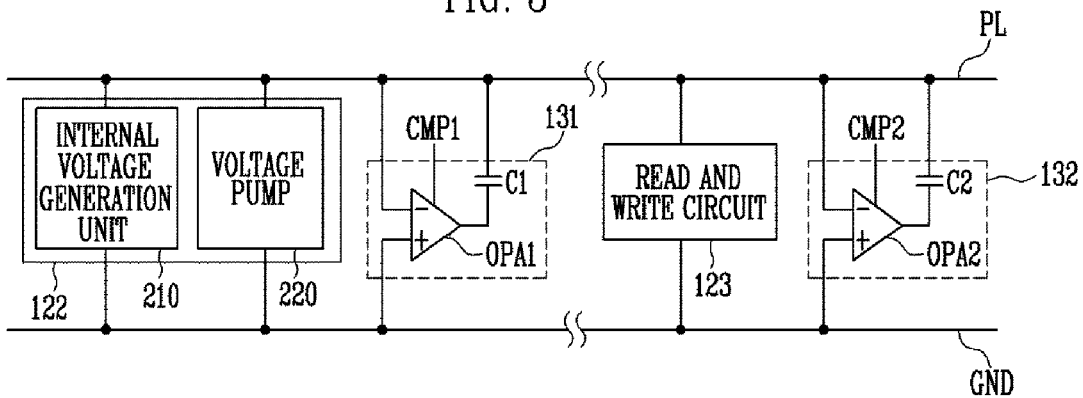
FIG. 3 is a block diagram illustrating a voltage generator, a read and write circuit, and first and second current compensators according to another embodiment of the present invention.

Referring to FIG. 3, more detail is provided for the voltage generator 122, the read and write circuit 123, and the first and second current compensators 131 and 132 connected between the power output line PL and the ground line GND.

The power output line PL may transmit an internal power voltage generated in the internal voltage generation unit 210. As another example, the power output line PL may transmit the external power voltage.

The first and second current compensators 131 and 132 may be included in the current compensation circuit 130 of FIG. 1. The first and second current compensators 131 and 132 may be configured so as to provide current to the power output line PL when a peak current is generated inside the semiconductor device 100. The first and second current compensators 131 and 132 may be operated in response to first and second compensation control signals CMP1 and CMP2 from the control logic 140 (see FIG. 1), respectively. The compensation control signals CMP1 and CMP2 may be included in the compensation control signal CMP of FIG. 1, and may be individually controlled by the control logic 140.

The first current compensator 131 may include a first OP-amplifier OPA1 connected to the power output line PL, and a first capacitor C1 connected between the first OP-amplifier OPA1 and the power output line PL. The second current compensator 132 may include a second OP-amplifier OPA2 connected to the power output line PL, and a second capacitor C2 connected between the second OP-amplifier OPA2 and the power output line PL.

The read and write circuit 123 and the voltage pump 220 in the peripheral circuit 120 of FIG. 1 may consume large amounts of current when performing a specific operation. In one example, when a high voltage is generated by charging the plurality of capacitors inside the voltage pump 220 when the program operation is performed, the large amount of current may be consumed in the voltage pump 220. In another example, when the bit lines BL are precharged when a read operation is performed, the large amount of current may be consumed in the read and write circuit 123. Thus, the voltage of the power output line PL may be unstable due to the current consumption of the read and write circuit 123 and the voltage pump 220.

However, according to an embodiment of the present invention, the first current compensator 131 may be adjacently disposed to the voltage pump 220, and may provide compensation current for the current consumed in the voltage pump 220. The second current compensator 132 may be adjacently disposed to the read and write circuit 123 and may provide compensation current for the current consumed in the read and write circuit 123.

Figure 4:
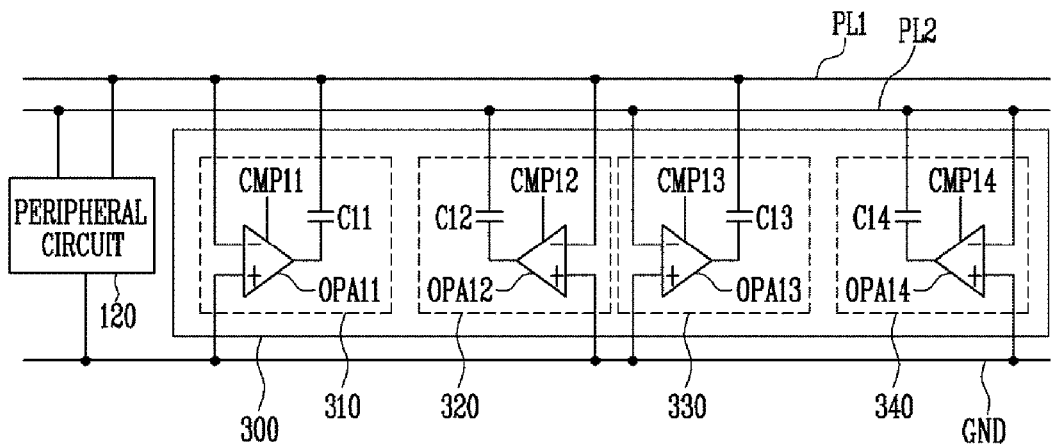
FIG. 4 is a block diagram illustrating a peripheral circuit and a current compensation circuit according to yet another embodiment of the present invention.

Referring to FIG. 4, the peripheral circuit 120 and the current compensation circuit 300 may be connected between a first power output line PL1 and the ground line GND, and between a second power output line PL2 and the ground line GND.

The first power output line PL1 may transmit an internal power voltage generated in the internal voltage generation unit 210. The second power output line PL2 may transmit the external power voltage.

The peripheral circuit 120 may operate by using the internal power voltage transmitted through the first power output line PL1 and the external power voltage transmitted through the second power output line PL2. That is, the peripheral circuit 120 may have dual sources for power. For example, the voltage pump may generate a plurality of high voltages using the internal power voltage and the external power voltage. Some of the page buffers within the read and write circuit 123 (see FIG. 1) may use the internal power voltages, and the remaining page buffers may use the external power voltage.

The current compensation circuit 300 may be configured to provide current to the first and second power output lines PL1 and PL2 in response to first to fourth compensation control signals CMP11 to CMP14. The current compensation circuit 300 may include first to fourth current compensators 310 to 340.

Each current compensator may include an OP-amplifier and a capacitor. The first current compensator 310 may include a first OP-amplifier OPA11 connected to the first power output line PL1, and a first capacitor C11 connected between the first OP-amplifier OPA11 and the first output line PL1. The first current compensator 310 may provide current to the first power output line PL1.

The second current compensator 320 may include a second OP-amplifier OPA12 and a second capacitor C12. An inverse terminal and a non-inverse terminal of the second OP-amplifier OPA12 may be connected to the first power output line PL1 and the ground line GND, respectively, and the second capacitor C12 may be connected between an output terminal of the second OP-amplifier OPA12 and the second power output line PL2. The second current compensator 320 may provide current to the second power output line PL2 in response to the second compensation control signal CMP12. Even though the internal power voltage flowing through the first power output line PL1 is applicable due to the generation of the peak current, the voltage of the second power output line PL2 may be stably maintained.

The third current compensator 330 may include a third OP-amplifier OPA13 and a third capacitor C13. An inverse terminal and a non-inverse terminal of the third OP-amplifier OPA13 may be connected to the second power output line PL2 and the ground line GND, respectively, and the third capacitor C13 may be connected between an output terminal of the third OP-amplifier OPA13 and the first power output line PL1. The third current compensator 330 may provide current to the first power output line PL1 in response to the third compensation control signal CMP13. Even though the external power voltage flowing through the second power output line PL2 is applicable due to the generation of the peak current, the voltage of the first power output line PL1 may be stably maintained.

The fourth current compensator 340 may include a fourth OP-amplifier OPA14 connected to the second power output line PL2, and a fourth capacitor C14 connected between the fourth OP-amplifier OPA14 and the second output line PL2. The fourth compensator 340 may provide current to the second power output line PL2 in response to the fourth compensation control signal CMP14.

In FIG. 4, the current compensation circuit 300 may include the first to fourth current compensators 310 to 340. However, the technical spirit of the present invention is not limited thereto. The current compensation circuit 300 may include at least one of the first to fourth current compensators 310 to 340.

The first power output line PL1 may transmit the internal power voltage generated in the internal voltage generation unit 210, and the second power output line PL2 may transmit the external power voltage. However, it will be understood that the technical spirit of the present invention is not limited thereto. As another example, the internal voltage generation unit 210 may generate first and second internal power voltages having different voltage levels, and the first power output line PL1 may transmit the first internal power voltage, and the second power output line PL2 may transmit the second internal power voltage.

Figure 5:
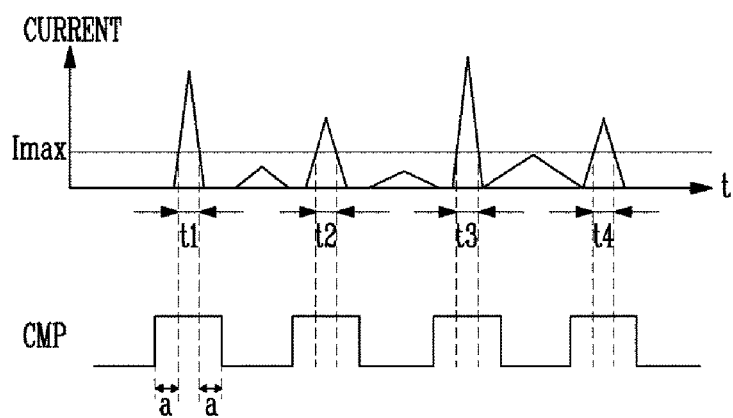
FIG. 5 is a diagram illustrating a relation between current generated in the semiconductor device and a compensation control signal.

Referring to FIG. 5, when the semiconductor device 100 is operated, current generated in the semiconductor device 100 varies. When current generated in the semiconductor device 100 is larger than a maximum current value Imax, a peak current is generated. In FIG. 5, the peak current may be generated in each of first to fourth time intervals t1 to t4.

When the peak current is generated, the compensation control signal CMP may be enabled. The compensation control signal CMP is first enabled by a specific time before the time interval in which the peak current is generated, and is disabled a specific time after completion of the time interval in which the peak current is generated. More particularly, the compensation control signal CMP is first enabled before the first time interval t1 by the specific time 'a,' and is disabled the specific time 'a' after completion of the first time interval t1. Similarly, the compensation control signal CMP is enabled and disabled for a time corresponding to each of the second to fourth time intervals t2 to t4.

Figure 6:
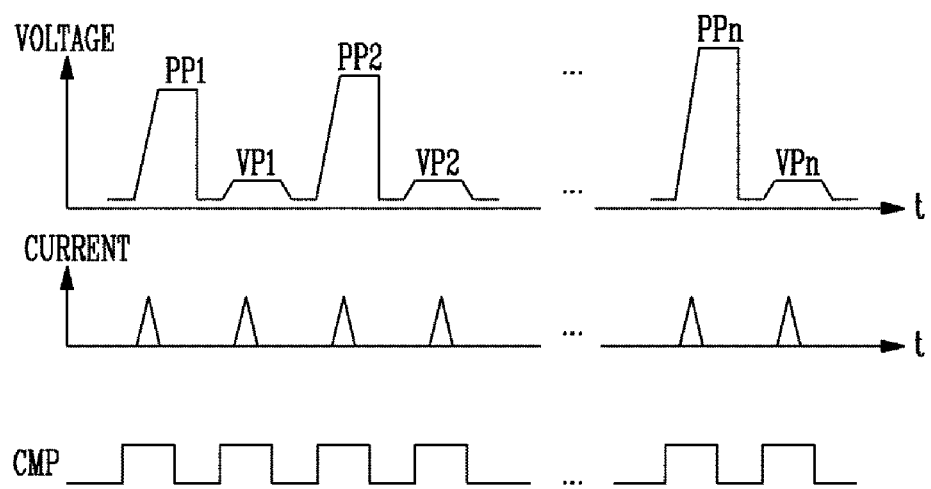
FIG. 6 is a diagram illustrating an example of a relation between current generated in the semiconductor device and a compensation control signal when an program operation is performed.

Referring to FIG. 6, a plurality of program pulses PP1 to PPn and a plurality of program verification pulses VP1 to VPn may be applied to the word line when a program operation is performed. In order to generate each program pulse, the voltage pump 220 may consume large amounts of current. Further, when each program verification pulse is applied, the voltage pump 220 may consume large amounts of current in order to generate the program verification pulse, and the read and write circuit 123 may consume large amounts of current in order to precharge the bit lines BL.

Accordingly, whenever the program pulse is applied, the generation of the peak current may be predicted. Further, whenever the verification pulse is applied, the generation of the peak current may be predicted.

The control logic (see FIG. 1) may enable the compensation control signal CMP for predetermined time intervals. The time intervals in which the compensation control signal CMP may be enabled may correspond to the time intervals in which the generation of the peak current is predicted. The compensation control signal CMP may be enabled before the time interval in which the generation of the peak current is predicted by the specific time 'a' (see FIG. 5), and may be disabled after the specific time 'a.'

Figure 7:
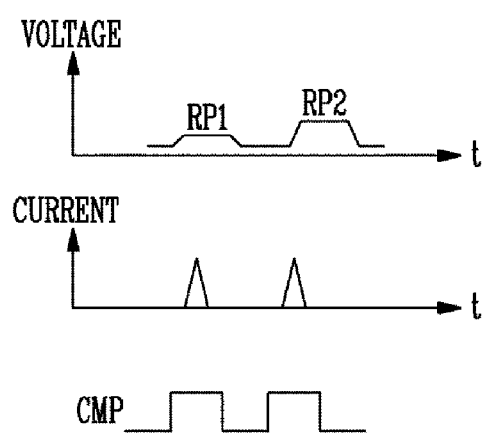
FIG. 7 is a diagram illustrating an example of a relation between current generated in the semiconductor device and a compensation control signal when a read operation is performed.

Referring to FIG. 7, at least one of the read pulses RP1 and RP2 may be applied to the word line. The read pulses may be applied to the word line selected from among the word lines WL, and pass pulses of a high voltage may be applied to the non-selected word lines. The voltage pump 220 may consume large amounts of current in order to generate the read pulses and the pass pulses, and the read and write circuit 123 may consume large amounts of current in order to precharge the bit lines BL.

The control logic 140 (see FIG. 1) may enable the compensation control signal CMP for predetermined time intervals when the read operation is performed. The time intervals in which the compensation control signal CMP is enabled may correspond to the time intervals in which the generation of the peak current may be predicted.

According to various embodiments of the present invention, the current compensation circuit including an OP-amplifier and a capacitor is provided. Accordingly, the area of a semiconductor device may decrease despite demand for additional current.

As described above, various embodiments have been disclosed in the drawings and the specification. The specific terms used herein are for purposes of illustration, and do not limit the scope of the present invention defined in the claims. Accordingly, those skilled in the art will appreciate that various modifications and equivalent examples that may be made without departing from the scope and spirit of the present invention. Therefore, the scope of the present invention will be defined by the technical spirit of the accompanying claims.

What is claimed is:

1. A semiconductor device, comprising;
   a peripheral circuit;
   a first power output line configured to transmit an external power voltage to the peripheral circuit;
   an internal voltage generation unit configured to generate an internal power voltage by using the external power voltage from the first power output line;
   a second power output line, different from the first output line, configured to transmit the internal power voltage to the peripheral circuit; and
   a first current compensator configured to provide a compensation current to a one of the first and second power output lines such that its voltage is stably maintained, the first current compensator including a first OP-amplifier having a first and second input terminals and a first output terminal, and a capacitor having first and second terminals, wherein the first input terminal is directly coupled to the other one of the first and second power output lines, the second input terminal is connected to a ground line, the first output terminal is connected to the first terminal, and the second terminal is connected to the one of the first and second power output lines.

2. The semiconductor device of claim 1, further comprising a second current compensator including a second OP-amplifier, the second current compensator including a second OP-amplifier having a third and fourth input terminals and a second output terminal, and a capacitor having third and fourth terminals, wherein the third input terminal is directly coupled to the one of the first and second power output lines, the fourth input terminal is connected to the ground line, the second output terminal is connected to the third terminal, and the fourth terminal is connected to the other one of the first and second power output lines.

3. The semiconductor device of claim 2, further comprising:
   a control logic configured to control the peripheral circuit, wherein the control logic is configured to enable a first and second compensation control signals for a predetermined time interval,
   wherein the first and second OP-amplifiers are activated according to the first and second compensation control signals, respectively.

4. The semiconductor device of claim 1, further comprising:
   a third current compensator including a third OP-amplifier connected to the first power output line and a third capacitor connected between an output terminal of the third OP-amplifier and the first power output line; and
   a fourth current compensator including a fourth OP-amplifier connected to the second power output line and a fourth capacitor connected between an output terminal of the fourth OP-amplifier and the second power output line.

5. The semiconductor device of claim 4, further comprising:
   a control logic configured to control the peripheral circuit, wherein the control logic is configured to enable a first, third, and fourth compensation control signals for a predetermined time interval, wherein the first, third, and fourth OP-amplifiers are activated according to the first, third, and fourth compensation control signals.

6. The semiconductor device of claim 1, further comprising a memory cell array driven by the peripheral circuit,
   wherein the peripheral circuit comprises:
   a read and write circuit connected to the memory cell array through bit lines and operated by using the external power voltage and the internal power voltage received through the first and second power output lines, respectively;
   a voltage pump configured to generate high voltages by using the external power voltage and the internal power voltage received through the first and second power output lines;
   an address decoder connected to the memory cell array through word lines and configured to switch the high voltages to the word lines.

7. The semiconductor device of claim 6, wherein the first current compensator is adjacently disposed to the voltage pump.

8. The semiconductor device of claim 6, wherein the first current compensator is adjacently disposed to the read and write circuit.

* * * * *